(12) United States Patent
Kumar et al.

(10) Patent No.: US 10,431,269 B2
(45) Date of Patent: Oct. 1, 2019

(54) METHODS AND APPARATUS FOR REDUCING POWER CONSUMPTION IN MEMORY CIRCUITRY BY CONTROLLING PRECHARGE DURATION

(71) Applicant: Altera Corporation, San Jose, CA (US)

(72) Inventors: Rajiv Kumar, Penang (MY); Wei Yee Koay, Bayan Lepas (MY); Kuan Cheng Tang, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 467 days.

(21) Appl. No.: 14/613,933

(22) Filed: Feb. 4, 2015

(65) Prior Publication Data

US 2016/0225437 A1 Aug. 4, 2016

(51) Int. Cl.
*G11C 7/12* (2006.01)
*G11C 11/419* (2006.01)
*G11C 11/418* (2006.01)
*G11C 7/22* (2006.01)
*G11C 8/16* (2006.01)

(52) U.S. Cl.
CPC ............... *G11C 7/12* (2013.01); *G11C 7/22* (2013.01); *G11C 8/16* (2013.01); *G11C 11/418* (2013.01); *G11C 11/419* (2013.01); *G11C 2207/2227* (2013.01)

(58) Field of Classification Search
CPC ........... G11C 8/12; G11C 8/14; G11C 11/419; G11C 7/12
See application file for complete search history.

(56) References Cited

U.S. PATENT DOCUMENTS

| 5,313,434 | A | * | 5/1994 | Abe | G11C 7/1048 365/190 |
| 5,699,309 | A | * | 12/1997 | Cronin, III | G11C 7/12 365/203 |
| 5,828,610 | A | * | 10/1998 | Rogers | G11C 7/12 365/189.02 |
| 5,991,223 | A | * | 11/1999 | Kozaru | G11C 7/1018 365/230.03 |
| 6,166,985 | A | | 12/2000 | Daniel et al. | |

(Continued)

FOREIGN PATENT DOCUMENTS

| CN | 101364432 A | 2/2009 |
| CN | 103875038 A | 6/2014 |
| WO | 97/43766 A1 | 11/1997 |

*Primary Examiner* — Vanthu T Nguyen
(74) *Attorney, Agent, or Firm* — Treyz Law Group, P.C.; Jason Tsai; Tianyi He

(57) ABSTRACT

Integrated circuits with volatile random-access memory cells are provided. A memory cell may be coupled to write bit lines and a read bit line. The write bit line may not be coupled to any precharge circuitry. The read bit line may only be precharged during memory access operations. In one suitable arrangement, the read bit line may be precharge immediately after an address decoding operation and before an evaluation phase. In another suitable arrangement, the read bit line may be precharged after an addressing decoding operation and in parallel with the evaluation phase. In either arrangement, a substantial amount of leakage and active power can be reduced.

9 Claims, 7 Drawing Sheets

(56) References Cited

U.S. PATENT DOCUMENTS

| | | | |
|---|---|---|---|
| 6,480,947 B1 * | 11/2002 | Hasegawa | G06F 13/1689 365/189.05 |
| 6,765,831 B2 * | 7/2004 | Oikawa | G11C 11/22 365/189.05 |
| 6,876,571 B1 | 4/2005 | Khellah et al. | |
| 7,193,887 B2 | 3/2007 | Wood | |
| 7,304,895 B2 | 12/2007 | Joshi et al. | |
| 7,504,695 B2 | 3/2009 | Martelloni et al. | |
| 7,512,030 B2 | 3/2009 | Houston et al. | |
| 7,760,541 B2 | 7/2010 | Adams et al. | |
| 7,852,693 B2 | 12/2010 | Christensen et al. | |
| 7,920,409 B1 | 4/2011 | Clark et al. | |
| 8,064,271 B2 * | 11/2011 | Houston | G11C 7/12 365/189.06 |
| 2002/0048210 A1 * | 4/2002 | Tomotani | G11C 8/10 365/230.03 |
| 2002/0194424 A1 | 12/2002 | Hasegawa et al. | |
| 2007/0070773 A1 | 3/2007 | Houston | |
| 2007/0153599 A1 | 7/2007 | Joshi et al. | |
| 2007/0280030 A1 | 12/2007 | Ramaraju et al. | |
| 2009/0040846 A1 | 2/2009 | Chang | |
| 2010/0208505 A1 | 8/2010 | Turier et al. | |
| 2011/0013467 A1 | 1/2011 | Moore | |
| 2013/0010544 A1 * | 1/2013 | Lin | G11C 11/417 365/189.05 |
| 2013/0286718 A1 | 10/2013 | Krilic | |
| 2014/0104960 A1 | 4/2014 | Iyer et al. | |
| 2014/0269091 A1 * | 9/2014 | Zheng | G11C 16/28 365/185.21 |
| 2014/0286096 A1 * | 9/2014 | Chong | G11C 7/18 365/185.06 |

* cited by examiner

METHODS AND APPARATUS FOR REDUCING POWER CONSUMPTION IN MEMORY CIRCUITRY BY CONTROLLING PRECHARGE DURATION

BACKGROUND

This relates to integrated circuits with memory and, more particularly, to volatile memory elements.

Integrated circuits often contain volatile memory elements. A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. Volatile memory elements such as SRAM cells are typically based on cross-coupled inverters (latches). In each memory element, the cross-coupled inverters are connected to a data line via an address transistor that is turned on when data is being read from or written into the memory element. When no data is being read from or written into the memory element, the address transistor is turned off to isolate the memory element.

In conventional memory design, each data line is precharged prior to every read/write operation to help maximize memory performance. Even when the address transistor is turned off, however, leakage current can flow from the precharged data line through the deactivated address transistor. This is exacerbated as the size of address transistors are being increased to help improve read performance. Leakage generated in this way can account up to 70% or more of the total leakage in a memory array and consumes an excessive amount of power.

It is within this context that the embodiments described herein arise.

SUMMARY

This disclosure relates generally to integrated circuits and, more particularly, to integrated circuits with memory cells. In accordance with an embodiment, an integrated circuit is provided that includes a memory cell, a bit line that is coupled to the memory cell, a precharge transistor that is coupled to the bit line, and a decoder for addressing the memory cell. The decoder may be used to determine whether the memory cell is to be selected during a decode time period. The precharge transistor may be turned off during the entirety of the decode time period. The bit line may be floating or may be discharged using a pull-down transistor whenever the precharge transistor is turned off.

The memory cell may also be coupled to a word line on which word line signal is provided. In one arrangement, the precharge transistor may be turned on while the word line signal is deasserted (e.g., the word line signal and a precharge signal that controls the precharge transistor should not be simultaneously asserted). In another arrangement, the precharge transistor may be turned on while the word line signal is asserted (e.g., the word line signal and the precharge signal should be simultaneously asserted). In other words, the bit line precharging and the evaluation phase of a memory read operation may be performed in parallel or separate time periods.

The memory cell may be also coupled to additional write bit lines. The write bit lines may not be coupled to any precharge circuitry (i.e., only the read bit line should be precharged during memory access operations without precharging the write bit lines).

Further features of the present invention, its nature and various advantages will be more apparent from the accompanying drawings and the following detailed description.

DETAILED DESCRIPTION

Embodiments of the present invention relate to integrated circuit memory elements and, in particular, to improved schemes for reducing leakage in the memory elements. It will be recognized by one skilled in the art, that the present exemplary embodiments may be practiced without some or all of these specific details. In other instances, well-known operations have not been described in detail in order not to unnecessarily obscure the present embodiments.

The integrated circuit memory elements, which are sometimes referred to as memory cells, may contain any suitable number of transistors. The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
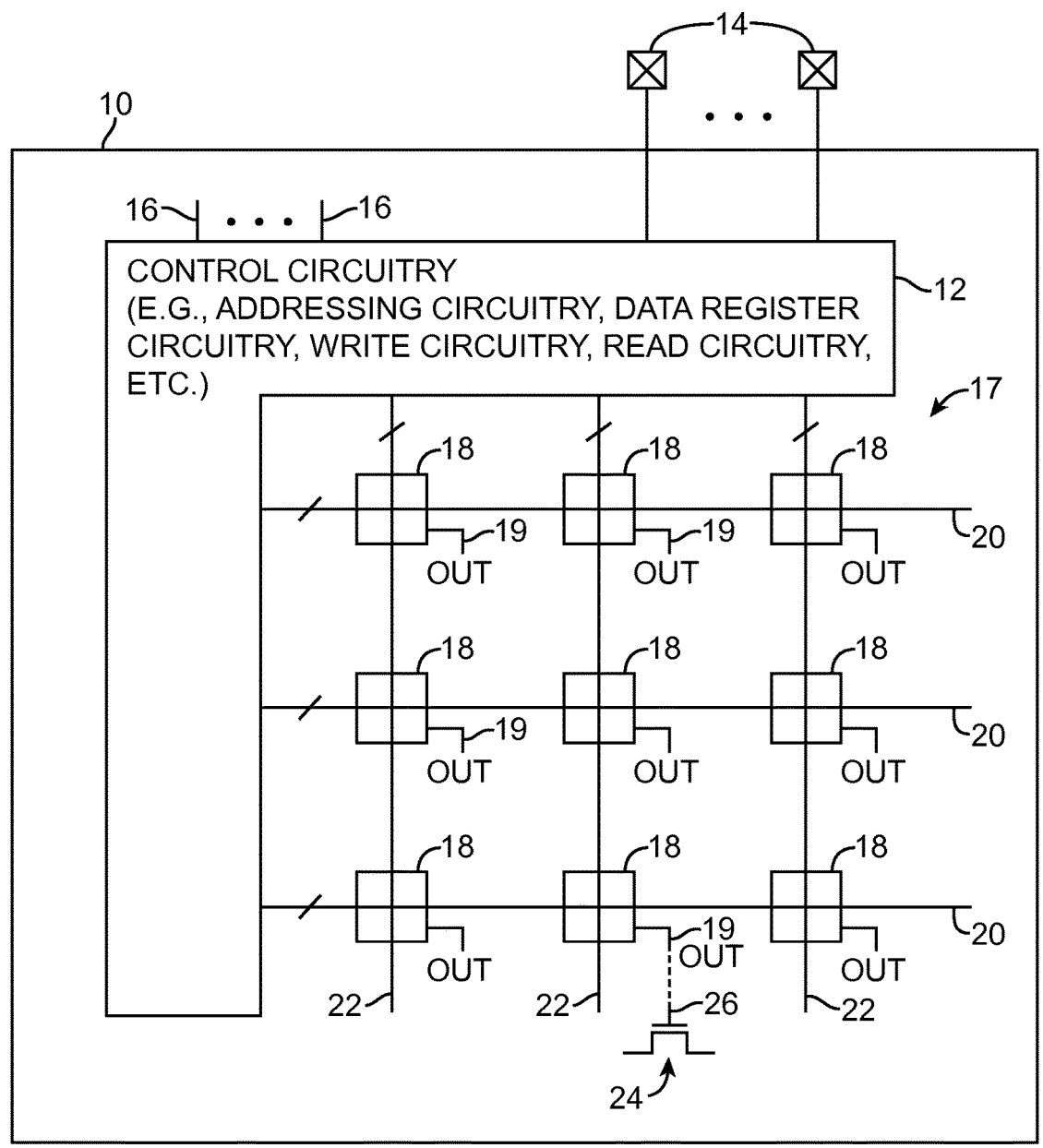
FIG. 1 is a diagram of an illustrative integrated circuit with a memory element array in accordance with an embodiment.

FIG. 1 shows an integrated circuit that may include an array of memory elements (cells) 18. Any suitable memory array architecture may be used for memory cells 18. One suitable arrangement is shown in FIG. 1. There are only three rows and columns of memory cells 18 in the illustrative array of FIG. 1, but in general there may be hundreds or thousands of rows and columns in memory array 17. Array 17 may be one of a number of arrays on a given device 10, may be a subarray that is part of a larger array, or may be any other suitable group of memory cells 18.

Each memory element 18 may be formed from a number of transistors configured to form a bistable circuit (i.e., a latch-type circuit). True and complement data storage nodes in the bistable circuit element can store corresponding true and complement versions of a data bit.

A bistable circuit element may be based on any suitable number of transistors. For example, the bistable portion of each memory element may be formed from cross-coupled inverters, from groups of multiple inverter-like circuits (e.g., in a distributed configuration that provides enhanced immunity from soft-error-upset events, etc.). Arrangements with bistable elements formed from cross-coupled inverting pairs are sometimes described herein as an example. This is, however, merely illustrative. Memory elements 18 may be formed using any suitable memory cell architecture.

Each memory element may supply a corresponding output signal OUT at a corresponding output path 19. In CRAM arrays, each signal OUT is a static output control signal that may be conveyed over a corresponding path 26 and may be used in configuring a corresponding transistor such as pass transistor 24 or other circuit element in an associated programmable logic circuit.

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, write circuitry, read circuitry, etc. Control circuitry 12 may use the power supply voltages supplied by pins 14 to produce desired time-varying and/or fixed signals on paths such as paths 20 and 22.

There may, in general, be any suitable number of conductive lines associated with paths 20 and 22. For example, each row of array 17 may have associated address lines (e.g., a true address line and a complement address line) and associated read/write enable lines in a respective one of paths 20 (as examples). Each column of array 17 may have a respective path 20 that includes data lines (e.g., a true data line and a complement data line). A clear signal may be routed to all of the cells in array 17 simultaneously over a common clear line. The clear line may be oriented vertically so that there is one branch of the clear line in each path 22 or may be oriented horizontally so that there is one branch of the clear line in each path 20. The clear line need not be necessary.

Power can also be distributed in this type of global fashion. For example, a positive power supply voltage Vcc may be supplied in parallel to each cell 18 using a pattern of shared horizontal or vertical conductors. A ground voltage Vss may likewise be supplied in parallel to cells 18 using a pattern of shared horizontal or vertical lines. Control lines such as address lines and data lines are typically orthogonal to each other (e.g., address lines are vertical while data lines are horizontal or vice versa).

The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

The signals that are supplied to memory elements 18 may sometimes be collectively referred to as control signals. In particular contexts, some of these signals may be referred to as power signals, clear signals, data signals, address signals, etc. These different signal types are not mutually exclusive. For example, a clear signal for array 17 may serve as a type of control (address) signal that can be used to clear array 17. This clear signal may also serve as a type of power signal by powering inverter-like circuitry in cells 18. Likewise, because clearing operations serve to place logic zeros in memory cells 18, clear signals may serve as a type of data signal.

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, 0.8 volts, less than 0.8 volts, or any other suitable voltage. Ground voltage Vss may be zero volts (as an example). In a typical arrangement, power supply voltages Vcc may be 0.8 volts, Vss may be zero volts, and the signal levels for address, data, and clear signals may range from zero volts (when low) to 0.8 volts (when high). Arrangements in which Vcc varies as a function of time, in which Vss is less than zero volts, and in which control signals are overdriven (i.e., in which control signals have signal strengths larger than Vcc-Vss) may also be used.

Figure 2:
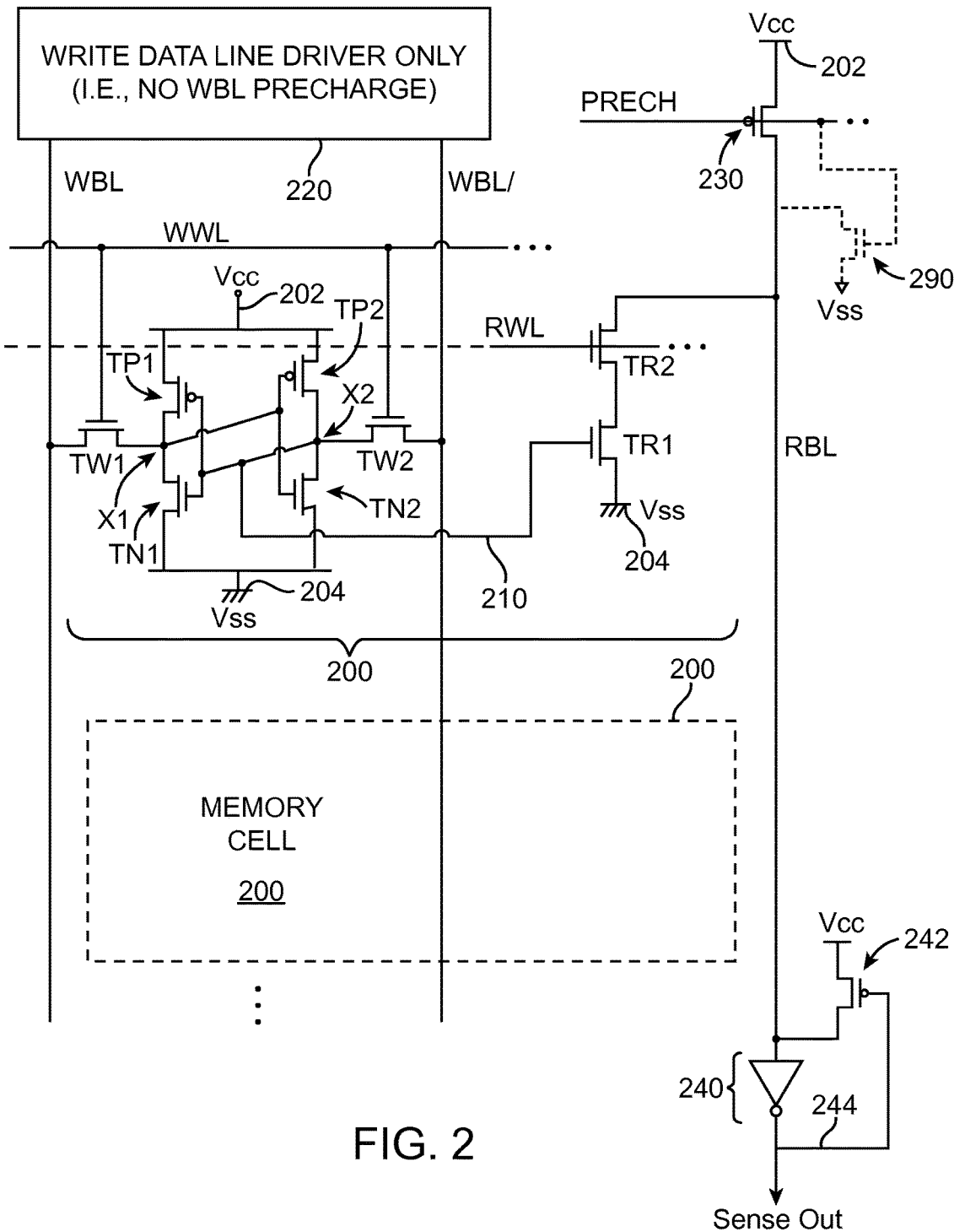
FIG. 2 is a diagram of an illustrative column of memory cells and associated precharge circuitry in accordance with an embodiment.

An illustrative configuration that may be used for a memory cell is shown in FIG. 2. As shown in FIG. 2, memory cell 200 may include a bistable element that is formed from a pair of cross-coupled inverters (i.e., transistors TP1, TN1, TP2, and TN2). In particular, a first inverter may include p-channel transistor TP1 and n-channel transistor TN1 coupled in series between a positive power supply line 202 (e.g., a power supply line on which positive power supply voltage Vcc is provided) and a ground power supply line 204 (e.g., a power supply line on which ground power supply voltage Vss is provided). A second inverter may include p-channel transistor TP2 and n-channel transistor TN2 coupled in series between power supply lines 202 and 204. N-channel transistors TN1 and TN2 may be referred to as memory cell "pull-down" transistors, whereas p-channel transistors TP1 and TP2 may be referred to as memory cell "pull-up" transistors.

The input of the first inverter may be coupled to the output of the second inverter, whereas the input of second inverter may be coupled to the output of the first inverter. The output of the first inverter may serve as a first internal data storage node X1 for cell 200 while the output of the second inverter may serve as a second internal data storage node X2 for cell 200. The bistable storage portion of memory cell 200 configured in this way may be used to store a single bit of data (e.g., the first and second internal data storage nodes may store true and complement versions of a single data bit, respectively).

A first write bit line WBL and a second write bit line WBL/ (sometimes referred to as true and complementary data lines, respectively) may be used in writing data into the bistable element using differential write access/address transistors TW1 and TW2. In general, the terms "bit lines" and "data lines" can be used interchangeably. When it is desired to write data into the bistable element, data may be placed on bit line WBL and a complementary version of the data may be placed on complementary bit line WBL/. Write word line (or address) signal WWL may then be asserted to load the data into the bistable memory element. During normal operation, write address signal WWL may be deasserted and the data on node X2 may be used as an output.

Memory cell 200 may also include a read buffer transistor TR1 and a read access/address transistor TR2 that serve collectively as a read circuit (sometimes referred to as a "read buffer circuit") for reading data from node X2 via read bit line RBL. In particular, transistor TR1 may be an n-channel transistor that includes a gate terminal that is connected to memory output node X2 via path 210, a source terminal that is coupled to ground line 204, and a drain terminal. Transistor TR2 may be an n-channel transistor that includes a gate terminal that receives a read word line (or address) signal RWL, a source terminal that is coupled to the drain terminal of transistor TR1, and a drain terminal that is coupled to read bit line RBL.

When it is desired to read data from the bistable portion, read address signal RWL can be asserted to turn on read address transistor TR2. In response to asserting RWL, the voltage on the read bit line RBL may start to fall depending on the value of the stored content. For example, if node X2 is high, transistor TR1 will be activated and will pull the voltage on read bit line RBL towards ground. As another example, if node X2 is low, transistor TR1 will be turned off, and the voltage on read bit line RBL will remain high. During normal operation, read word line signal RWL may be deasserted.

As shown in FIG. 2, read bit line RBL may also be coupled to a read out circuit 240. As an example, read out circuit 240 may be an inverting circuit having an input that is coupled to RBL and an output on which read output signal SenseOut is generated. As described above, if the voltage on RBL discharges towards ground during a read operation, inverting circuit 240 may sense this drop and drive SenseOut to a logic "1". In the other scenario for which the voltage on RBL remains high, inverting circuit 240 may keep SenseOut at logic "0". Read bit line RBL may also be coupled to a "keeper" or "half latch" transistor 242 that helps inverter 240 pull up RBL when SenseOut is low. Circuit 240 is sometimes referred to as a "sense amplifier."

More than one memory cell 200 may be coupled to the write and read bit lines to form a column of memory cells. For example, each column of memory cells may include at least 10 memory cells, at least 50 memory cells, at least 100 memory cells, etc. The memory cell implementation of FIG. 2 in which cell 200 includes eight transistors (i.e., six transistors coupled to differential write bit lines and two associated read buffer circuit transistors coupled to a single-ended read bit line) may be referred to as an "8T" memory cell configuration.

In conventional 8T SRAM designs, the write and read bit lines are constantly being precharged during normal operation when the SRAM cell is not performing a read or a write. While this helps to improve overall memory performance, a constant leakage current may flow from the data lines to the ground line through the memory cell pull down transistors (i.e., through the n-channel pull down transistor in the bistable portion of the memory cell and/or through the n-channel pull down transistor in the read buffer circuit). This leakage is exacerbated as the size of these memory cell pull down transistors are enlarged in an effort to boost read performance.

In scenarios in which an integrated circuit includes multiple SRAM banks, every bank in the integrated circuit is being precharged even if only one of the many SRAM banks is being accessed. This results in substantial leakage currents being generated in unselected SRAM banks. Leakage generated as such accounts for 70% or more of the total SRAM leakage and can consume an excessive amount of power.

In accordance with an embodiment, the write bit lines may never be precharged, whereas the read bit line may be coupled to a precharge transistor that is only activated during a read operation. Referring back to FIG. 2, the write bit lines WBL and WBL/ may only be coupled to write data line driver circuitry 220 but may not be coupled to any precharge circuitry (i.e., the integrated circuit does not include any write data line precharge circuitry). When the write drivers are not activated, the write bit lines may be floating or may be discharged to zero volts.

While the write bit line is not coupled to any precharge circuitry, the read bit line RBL is coupled to a precharge circuit such as pull-up transistor 230. In particular, pull-up transistor may have a source terminal that is coupled to positive power supply line 202, a drain terminal that is coupled to the read bit line RBL, and a gate terminal that receives a precharge control signal PRECH. During non-evaluate time periods (i.e., when the memory cell is not performing a read or a write), signal PRECH should remain deasserted so RBL is not being precharged. When PRECH is deasserted, transistor 230 is turned off and read bit line RBL may be floating or may be discharged to ground (e.g., using an optional auxiliary read bit line pull-down transistor 290).

Configured in this way, the amount of leakage that is flowing through the write and read bit lines from the precharge transistors is substantially reduced compared to the conventional 8T operation in which the read and write bit line precharge circuits are constantly active during non-evaluate time periods (e.g., the SRAM array leakage can be reduced by 50% or more).

Figure 3:
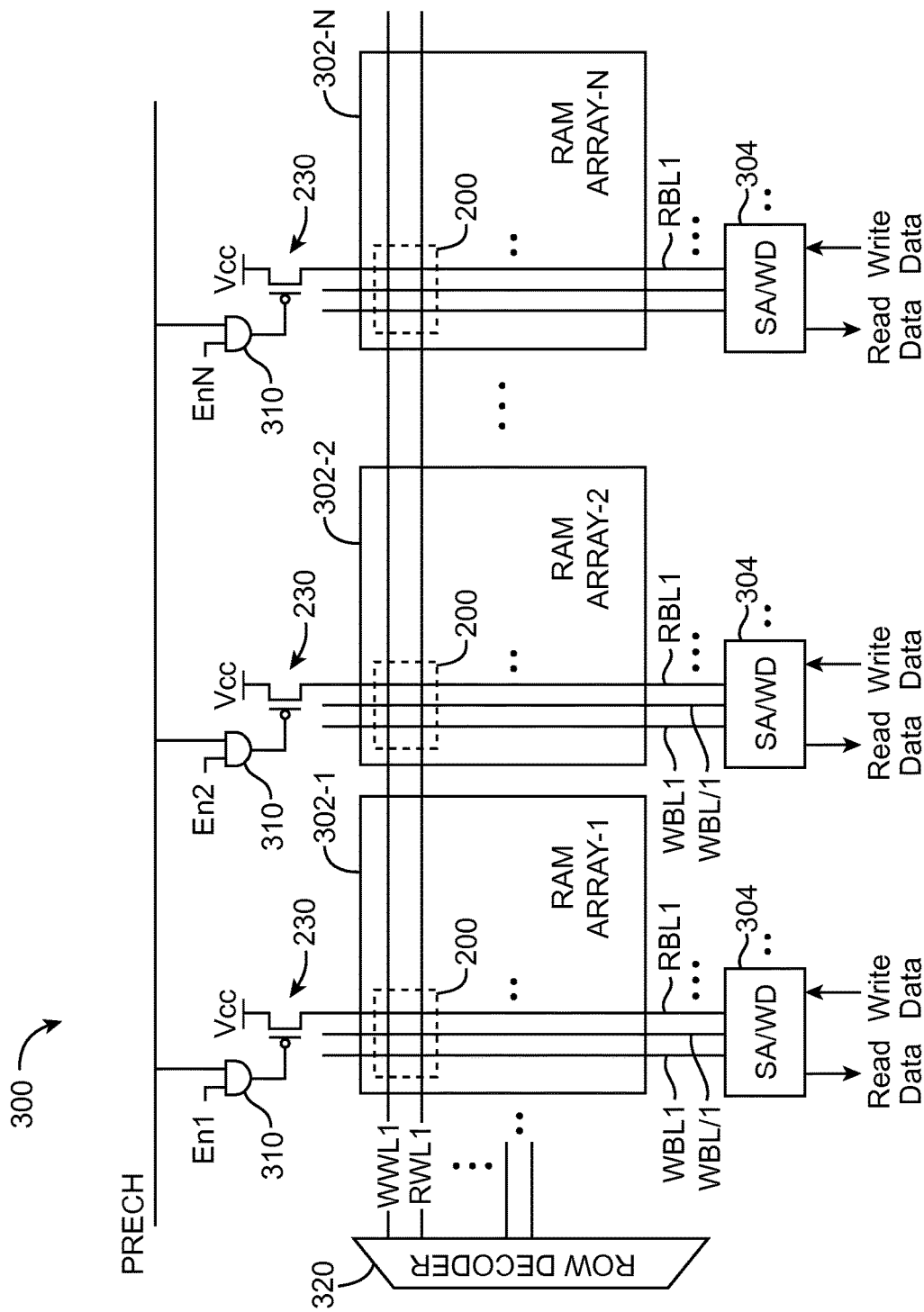
FIG. 3 is a diagram of an integrated circuit with multiple memory element arrays only one of which is selected for precharge in accordance with an embodiment.

FIG. 3 shows an integrated circuit 300 that includes a plurality of RAM arrays 302 (e.g., a first SRAM array 302-1, a second SRAM array 302-2, . . . , and an $N^{th}$ SRAM array 302-N). Each RAM array 302 may serve as a separate "page" in a single "book" or "bank" of SRAM arrays. As shown in FIG. 3, each memory cell 200 in each page may receive write and read word line signals WWL and RWL from a row decoder 320, receive write data from write drivers (WD) in an associated column circuit 304 via write bit lines WBL and WBL/, and output read data to the sense amplifier (SA) in the associated column circuit 304 via read bit lines RBL.

Each RAM array 302 may include any number of rows and columns of memory cells. Memory cells 200 in a given memory cell row in each array 302 may be addressed using a shared global write word line or a local write word line. Similarly, memory cells 200 in a given memory cell row in each array 302 may be addressed using a common read word line or a local read word line. Memory cells 200 in a given memory cell column may be coupled to a corresponding pair of write bit lines and a read bit line.

Each read bit line RBL may be coupled to a respective precharge transistor 230. Precharge transistor(s) 230 associated with the first array 302-1 may be gated using a first logic AND gate 310 that receives a first enable signal En1 (e.g., precharge transistors in other columns within array 302-1 may also be controlled using En1). Precharge transistor(s) 230 associated with the second array 302-2 may be gated using a second logic AND gate 310 that receives a second enable signal En2 (e.g., precharge transistors in other columns within array 302-2 may also be controlled using En1). Precharge transistor(s) 230 associated with the $N^{th}$ array may be gated using yet another logic AND gate 310 that receives an $N^{th}$ enable signal EnN (e.g., precharge transistors in other columns within array 302-N may also be controlled using EnN).

Configured in this way, a precharge signal PRECH is only passed through to a selected one of the RAM arrays by asserting only one of enable signal En1-EnN. For example, consider a scenario in which a single SRAM bank includes 8 arrays or "pages." Memory cells in a first page of the 8 pages may be accessed by asserting only gating signal En1 to precharge the first page while the other unselected pages (i.e., the $2^{nd}$ through $8^{th}$ pages) are left unprecharged. Memory cells in a second page of the 8 pages may be accessed by asserting only gating signal En2 to precharge the second page while the other unselected pages are left unprecharged. Memory cells in the eighth page may be accessed by asserting only gating signal En8 to precharge the eighth page while the other unselected pages (i.e., the $1^{st}$ through $7^{th}$ pages) are left unprecharged.

In other words, only the read bit lines in a selected one of the arrays may be precharged while the read bit lines in other unselected arrays should be left floating or driven to ground. The write bit lines in all of the arrays need not be precharged during read/write operations, as described above in connection with FIG. 2. Operated as such, the read bit line leakage and the active power can be minimized in the unselected arrays while only the selected array contributes to the read bit line leakage and active power, thereby significantly reducing RAM power consumption. The use of logic AND gates to gate the precharge signal is merely illustrative. If desired, other suitable ways of selectively precharge only a portion of the memory cells can be implemented.

Figure 4:
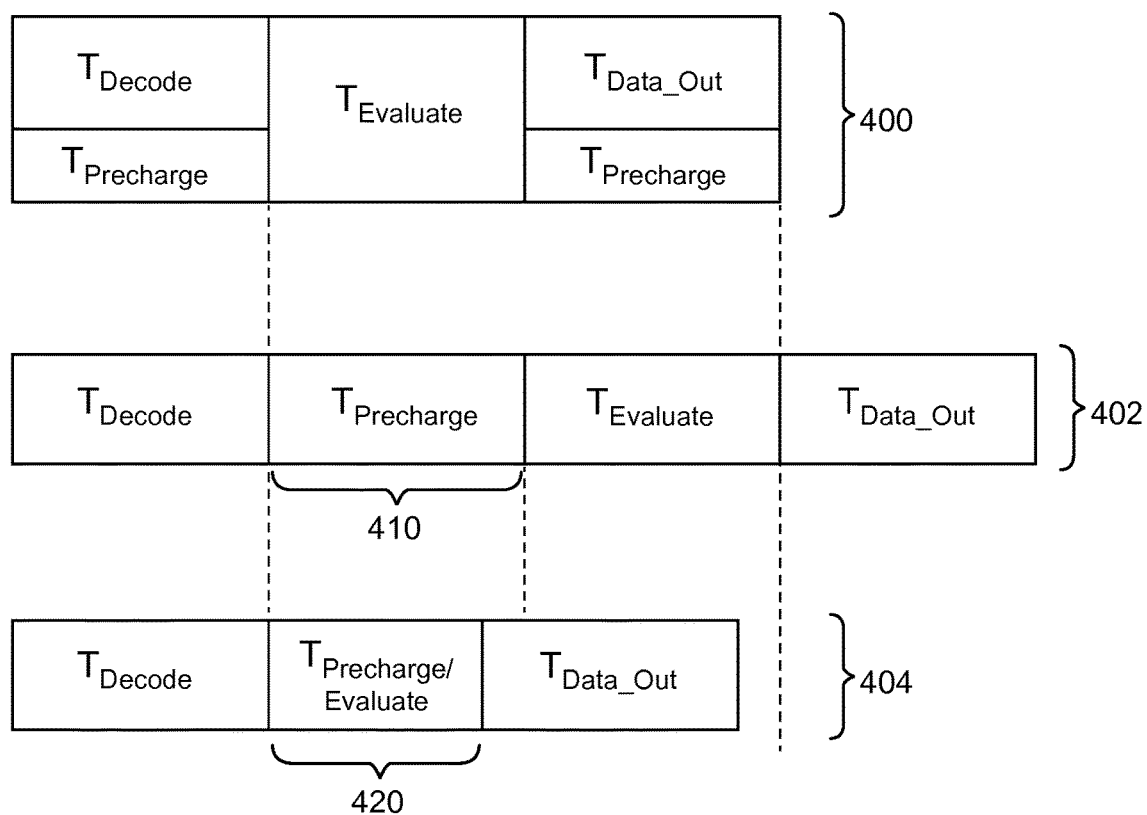
FIG. 4 is a diagram comparing different memory access modes in accordance with an embodiment.

FIG. 4 is a diagram comparing different memory access modes. Mode 400 represents one clock period of a conventional 8T SRAM read scheme. Mode 402 may represent one clock period of an illustrative low power and low speed memory access in accordance with an embodiment. Mode 404 may represent one clock cycle of an illustrative low power and high speed memory access in accordance with another embodiment.

Time period $T_{Decode}$ may represent an amount of time that is needed by the associated row/column decoders to address the selected memory cell(s). Time period $T_{Evalulate}$ may represent an amount of time that is needed for data to be read from or written into the selected memory cells (i.e., $T_{Evalulate}$ may be equal to the greater of an amount of time that is needed for the read bit line to charge up or discharge and the amount of time that is needed for data on the write bit lines to be transferred into the internal data storage nodes in the selected cells). Time period $T_{Data\_Out}$ may represent an amount of time that is needed for data to be properly latched and output (e.g., during a read operation).

As shown in FIG. 4, in the conventional read scheme 400, all the read and write bit lines are being precharged during both $T_{Decode}$ and $T_{Data\_Out}$. While this helps to improve performance, leakage and active power are wasted in all unselected SRAM memory cells.

In the low power low speed mode 402, bit line precharging is only performed immediately after $T_{Decode}$ and before $T_{Evalulate}$ (e.g., time period $T_{precharge}$ 410 may be interposed between $T_{Decode}$ and $T_{Evalulate}$). In other words, no bit line precharge should be performed during $T_{Decode}$ and $T_{Data\_Out}$. Precharging the bit line in this way can help reduce memory leakage and active power in all unselected cells but may increase the minimum clock cycle due to the extra time that is dedicated to the precharge operation 410. As shown in FIG. 4, the clock period associated with mode 402 may be greater than the clock period associated with mode 400 (i.e., mode 402 may be considered to be "slower" than mode 400).

In the low power high speed mode 404, bit line precharging may be performed in parallel with $T_{Evalulate}$ (e.g., the evaluate and precharge operations 420 are being performed simultaneously during time period $T_{Precharge/Evaluate}$). As with mode 402, no bit line precharge should be performed during $T_{Decode}$ and $T_{Data\_Out}$. Precharging the bit line in this way can help reduce memory leakage and active power in all unselected cells while further reducing the minimum clock cycle compared to mode 400. As shown in FIG. 4, the clock period associated with mode 404 may be actually smaller than the clock period associated with mode 400 (i.e., mode 404 may be considered to be "faster" than conventional mode 400).

Figure 5A:
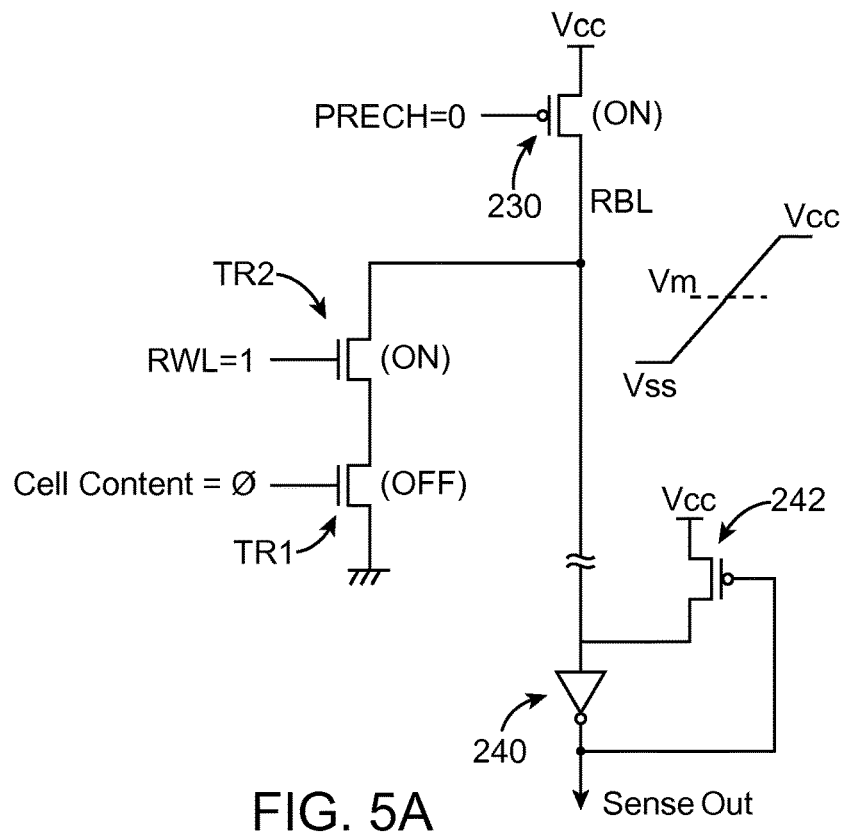
FIG. 5A is a diagram illustrating how a memory cell read port behaves when the memory cell is storing a logic "0" in accordance with an embodiment.
Figure 5B:
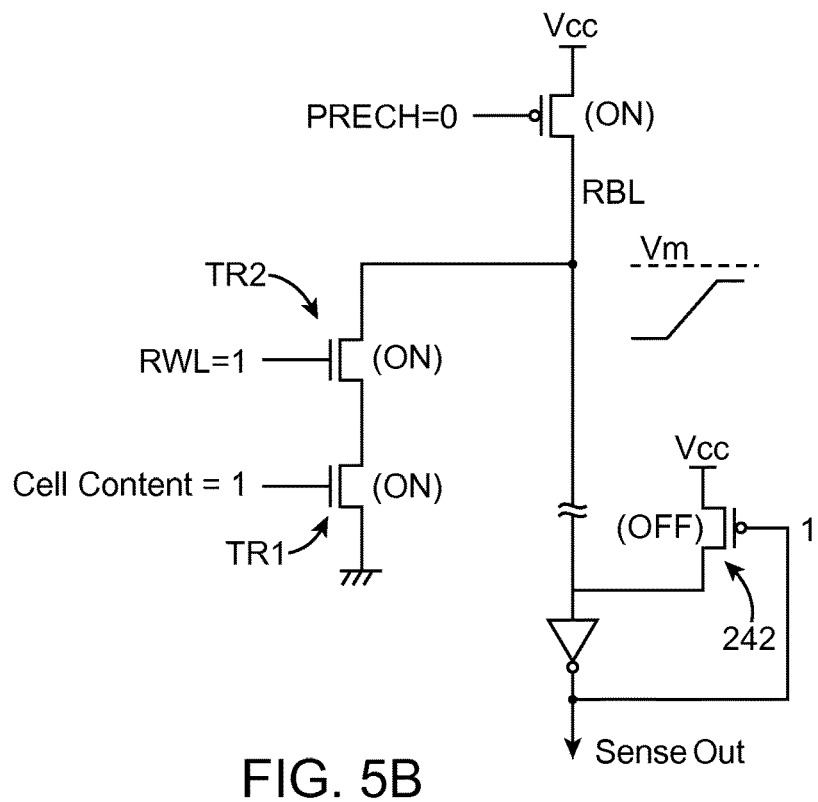
FIG. 5B is a diagram illustrating how a memory cell read port behaves when the memory cell is storing a logic "1" in accordance with an embodiment.

This increase in performance for mode 404 can be illustrated in the read scenarios shown in FIGS. 5A and 5B. FIG. 5A shows a scenario in which node X2 stores a logic "0". When node X2 is low, read buffer transistor TR1 is turned off. During a read operation, read word line RWL may be asserted at the same time that precharge signal PRECH is asserted, thereby turning on read address transistor TR2 and pull-up transistor 230, respectively.

Assuming that RBL is nominally driven to ground voltage Vss, signal SenseOut will be initially high and keeper transistor 242 is turned off. Thus, when PRECH is asserted, transistor 230 will pull RBL up towards Vcc without any contention since transistor TR1 is off. When RBL exceeds a switching threshold Vm, SenseOut may be driven low to turn on keeper transistor 242 and will serve to help precharge transistor 230 in pulling up RBL all the way up to Vcc (or other positive voltage level).

FIG. 5B shows a scenario in which node X2 stores a logic "1". When node X2 is high, read buffer transistor TR1 is turned on. During a read operation, read word line RWL may be asserted at the same time that signal PRECH is asserted, thereby turning on read address transistor TR2 and pull-up transistor 230, respectively.

Assuming that RBL is nominally driven to ground voltage Vss, signal SenseOut will be initially high and keeper transistor 242 is turned off. When PRECH is asserted, transistors TR1 and TR2 should be strong enough to keep RBL below the switching threshold Vm. Since keeper transistor 242 is turned off during the entirety of the read operation, there will be no contention between keeper transistor 242 and the pull down transistors TR1 and TR2. This is in contrast to conventional read schemes where the precharged bit lines will always turn on the keeper transistor, resulting in contention between the keeper transistor and the read buffer pull down transistors. The elimination of this pull-up contention in mode 404 helps to provide an incremental speed gain over the conventional read scheme.

Figure 6:
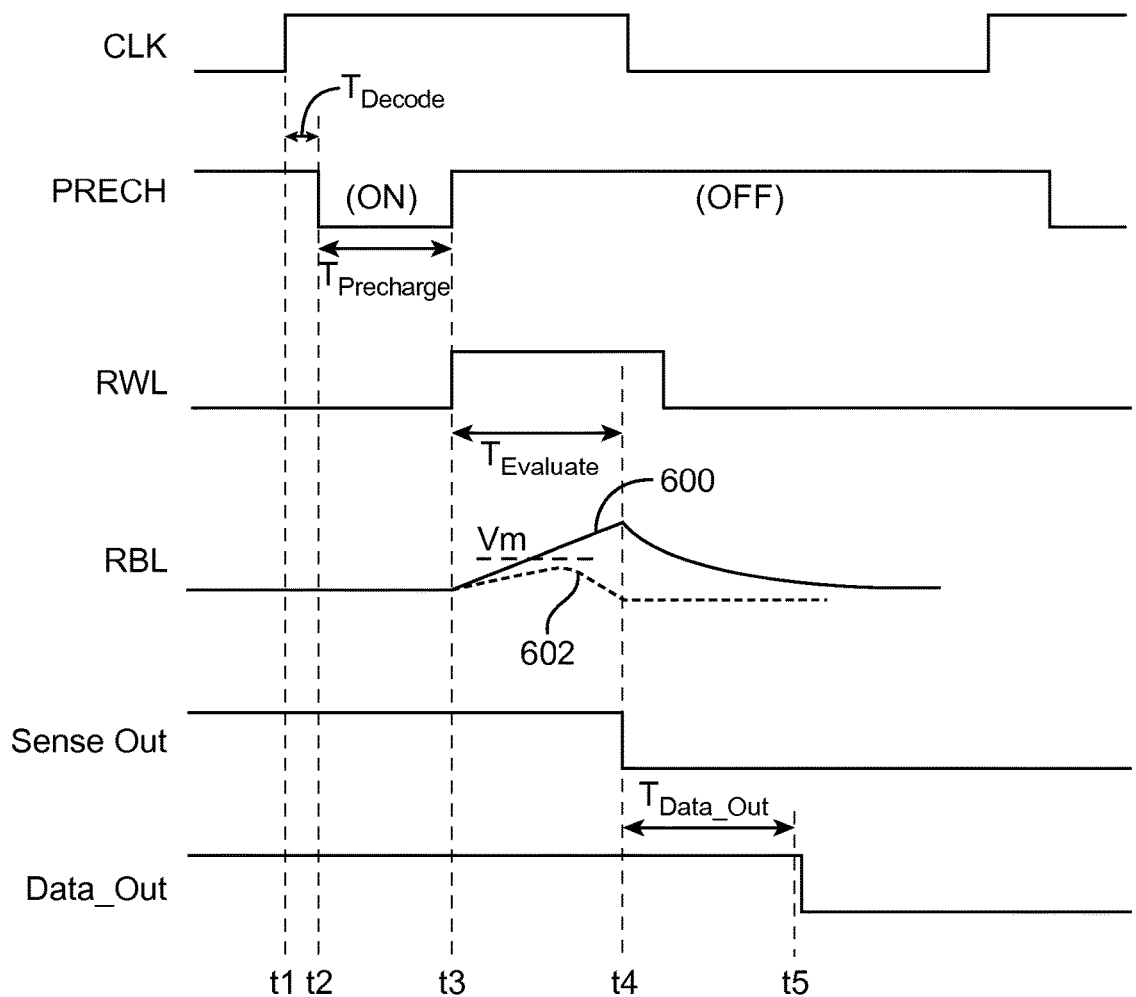
FIG. 6 is a timing diagram that illustrates the behavior of relevant waveforms during a low speed read operation in accordance with an embodiment.

FIG. 6 is a timing diagram that illustrates the behavior of relevant waveforms during a single clock cycle while the memory circuitry is operating in low speed mode 402. At time t1, a memory clock signal CLK may rise high to signify the start of a clock cycle and address decoding operations may begin. After a duration $T_{Decoder}$, signal PRECH may be asserted at time t2 for duration $T_{Precharge}$.

At time t3, signal PRECH may be deasserted and read word line RWL may be asserted to begin the evaluation phase. During the evaluation time period $T_{Evaluate}$, read bit line RBL may charge up past Vm (as indicated by waveform 600) if internal node X2 is equal to logic "0" or may remain below Vm (as indicated by waveform 602) if data storage node X2 is equal to logic "1".

In the scenario that RBL exceeds Vm, SenseOut may be driven low at time t4. After another time period $T_{Data\_Out}$, read data may be latched and output for further processing (at time t5). In the example of FIG. 6, the precharge operation is performed only between the address decoding operations and the evaluation phase (i.e., between time t2 and t3).

Figure 7:
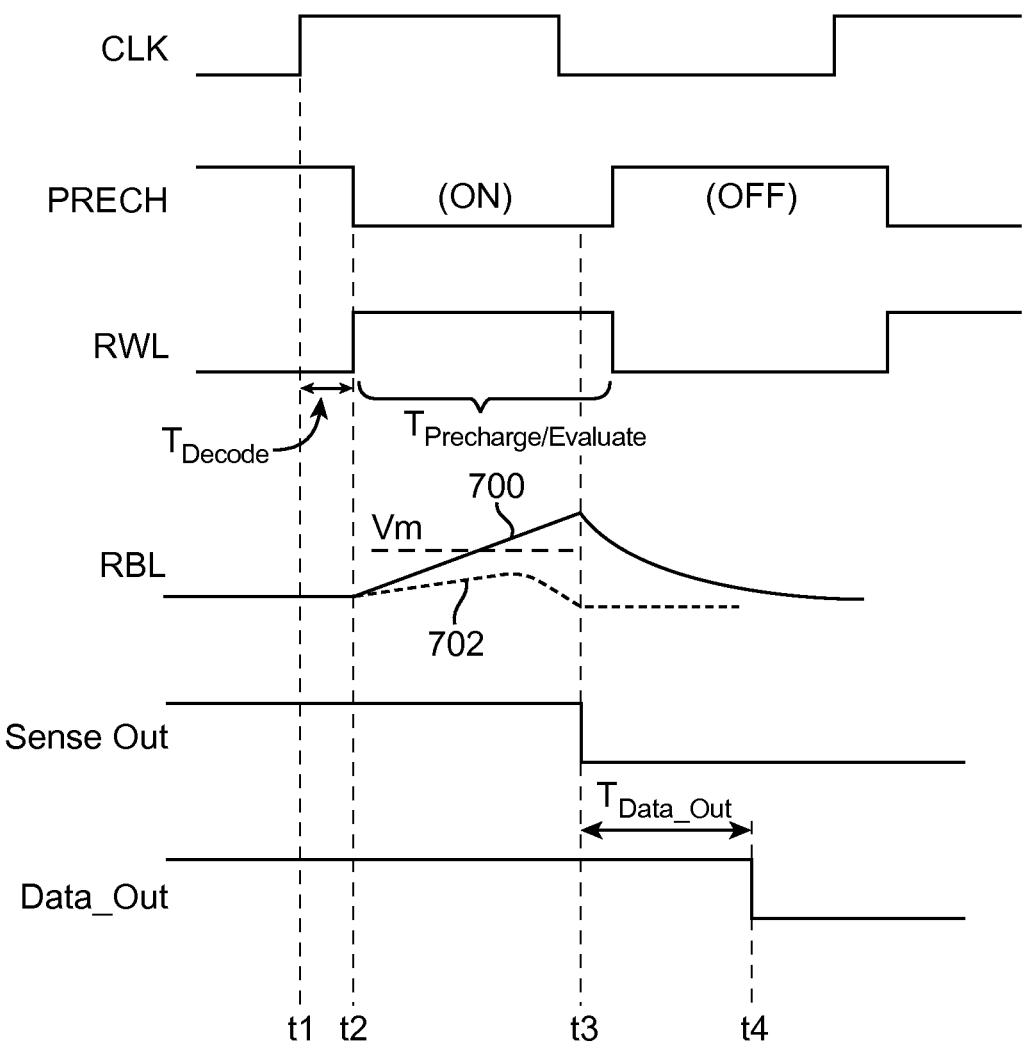
FIG. 7 is a timing diagram that illustrates the behavior of relevant waveforms during a high speed read operation in accordance with an embodiment.

FIG. 7 is a timing diagram that illustrates the behavior of relevant waveforms during a single clock cycle while the memory circuitry is operating in high speed mode 404. At time t1, a memory clock signal CLK may rise high to signify the start of a clock cycle and address decoding operations may begin. After a duration $T_{Decode}$, signal PRECH and read word line RWL may be simultaneously asserted at time t2 for duration $T_{Precharge/Evaluate}$ to precharge the read bit line and to evaluate the voltage value of the read bit line in parallel.

During time period $T_{Precharge/Evaluate}$, read bit line RBL may charge up past Vm (as indicated by waveform 700) if internal node X2 is equal to logic "0" or may remain below Vm (as indicated by waveform 702) if data storage node X2 is equal to logic "1". In the scenario that RBL exceeds Vm, SenseOut may be driven low at time t3. After another time period $T_{Data\_Out}$, read data may be latched and output for further processing (at time t4). In the example of FIG. 7, the precharge operation is performed in parallel with the evaluation phase while RWL is asserted.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The exemplary embodiments described herein that relate to an 8T memory cell having a read buffer circuit are merely illustrative and do not limit the scope of the present invention. If desired, the disclosed improved precharge schemes can be applied to memory cells having fewer than eight transistors, memory cells with more than eight transistors, memory cells having more than one read/write port, memory cells with more than two cross-coupled inverting circuits, and other types of memory cells.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. A method of operating an integrated circuit, comprising:
   during a decode time period, using a decoder circuit to address a memory cell;
   using a precharge circuit to precharge a bit line that is coupled to the memory cell;
   keeping the precharge circuit turned off during the decode time period; and
   after the bit line is precharged, asserting a word line signal to access the memory cell.

2. The method defined in claim 1, further comprising:
   turning on the precharge circuit immediately following the decode time period.

3. The method defined in claim 1, wherein the memory cell is also coupled to an additional bit line, the method further comprising:
   precharging the bit line without precharging the additional bit line during a memory access operation.

4. The method defined in claim 1, wherein the bit line comprises a read bit line, and wherein the memory cell is further coupled to at least one write bit line, the method further comprising:
   precharging only the read bit line without precharging the at least one write bit line during a memory access operation.

5. The method defined in claim 1, further comprising:
   actively discharging the bit line while the precharge circuit is turned off.

6. An integrated circuit, comprising:
   a first array of memory cells;
   a second array of memory cells;
   a word line that is coupled to the first array of memory cells and the second array of memory cells;
   first precharge circuits that are coupled to the first array of memory cells;
   second precharge circuits that are coupled to the second array of memory cells, wherein the first precharge circuits are activated to access at least one memory cell in the first array while the second precharge circuits are deactivated to reduce power consumption in the second array, and wherein the word line is driven high after the first precharge circuit is deactivated; and
   a row decoder that determines which row in the first and second arrays to access during a decode time period, wherein the first and second precharge circuits are turned off during the decode time period.

7. The integrated circuit defined in claim 6, wherein the memory cells in the first and second arrays are coupled to read and write bit lines, and wherein only the read bit lines are precharged during a memory access operation.

8. The integrated circuit defined in claim 6, wherein the word line comprises a row line that is directly coupled to the memory cells in the first and second array of memory cells.

9. The integrated circuit defined in claim 6, wherein each memory cell in the first and second arrays comprises eight transistors.

* * * * *